US007565121B2

United States Patent
Ko et al.

(10) Patent No.: US 7,565,121 B2
(45) Date of Patent: Jul. 21, 2009

(54) CLOCK NOISE CANCELING CIRCUIT

(75) Inventors: Joo Yul Ko, Kyungki-do (KR); Hak Sun Kim, Daejeon (KR); Won Tae Choi, Kyungki-do (KR); Won Wook So, Kyungki-do (KR)

(73) Assignee: Samsung Electro-Mechanics Co., Ltd., Suwon, Kyungki-Do (KR)

(*) Notice: Subject to any disclaimer, the term of this patent is extended or adjusted under 35 U.S.C. 154(b) by 428 days.

(21) Appl. No.: 11/566,587

(22) Filed: Dec. 4, 2006

(65) Prior Publication Data

US 2007/0195915 A1 Aug. 23, 2007

(30) Foreign Application Priority Data

Feb. 17, 2006 (KR) .................... 10-2006-0015435

(51) Int. Cl.
*H04B 7/08* (2006.01)
(52) U.S. Cl. .................. 455/136; 455/138; 455/232.1; 455/296
(58) Field of Classification Search .......... 455/310, 455/311, 296, 334, 341, 239.1, 127.2, 136, 455/138, 139, 226.1, 232.1
See application file for complete search history.

(56) References Cited

U.S. PATENT DOCUMENTS

| 6,151,354 | A  | * | 11/2000 | Abbey ..................... 375/211 |
| 6,222,503 | B1 | * | 4/2001  | Gietema et al. ............. 343/890 |
| 6,229,359 | B1 |   | 5/2001  | Chesavage |
| 6,812,824 | B1 | * | 11/2004 | Goldinger et al. .......... 340/10.1 |

* cited by examiner

*Primary Examiner*—Tony T Nguyen
(74) *Attorney, Agent, or Firm*—Lowe Hauptman Ham & Berner, LLP

(57) ABSTRACT

In a clock noise canceling circuit, a coupler extracts a signal from a clock signal. A filter selects a harmonic component of a preset frequency in the extraction signal from the coupler. A phase shifter phase inverts the harmonic component of the preset frequency from the filter. An AGC amplifier amplifies the phase-inverted harmonic component from the phase shifter. Also, a combiner combines the amplified component from the phase shifter with the clock signal to eliminate the harmonic component of the preset frequency from the clock signal. A power detector detects a power level of the harmonic component of the preset frequency in an output signal of the combiner. Additionally, a controller controls gain of the automatic gain control amplifier based on the power level of the harmonic component detected by the power detector, thereby canceling noises.

6 Claims, 5 Drawing Sheets

CLOCK NOISE CANCELING CIRCUIT

CLAIM OF PRIORITY

This application claims the benefit of Korean Patent Application No. 2006-15435 filed on Feb. 17, 2006 in the Korean Intellectual Property Office, the disclosure of which is incorporated herein by reference.

BACKGROUND OF THE INVENTION

1. Field of the Invention

The present invention relates to a clock noise canceling circuit applicable to an image sensor module which is employed in a Code-Division Multiple Access (CDMA) mobile phone. More particularly, the present invention relates to a clock noise canceling circuit which is designed to eliminate a harmonic component of a preset frequency from a clock signal of e.g., an image sensor, thereby rendering other parts or signals less susceptible to the harmonic component of the clock signal, and can be substituted for an electromagnetic (EMI) filter.

2. Description of the Related Art

In general, a CDMA mobile phone features a camera function besides a telephone function, which will be explained with reference to FIG. 1.

FIG. 1 is a configuration view illustrating a conventional CDMA mobile phone.

Referring to FIG. 1, the conventional CDMA mobile phone includes a controller 10, a telephone transmitter/receiver 20 and an image sensor module (ISM) 30. The controller 10 controls telephoning and image sensing according to user's selection. The telephone transmitter/receiver 20 transmits/receives a telephone signal under control of the controller 10. The image sensor module 30 senses an image under control of the controller 10.

As just described, the conventional CDMA mobile phone is equipped with the image sensor module 30, which is driven by supply of a clock signal. An explanation thereof will be given hereunder with reference to FIG. 2.

FIG. 2 is a view for explaining a clock signal of a conventional image sensor.

FIG. 2 illustrates an image sensor module (ISM) installed in the CDMA mobile phone. To operate the image sensor module (ISM), a sine-wave main clock MCLK signal generated by a clock signal generator (X-tal or TCXO) 11 is transferred to the CMOS image sensor and the image signal processing IC of the image sensor module 30 either directly or through a baseband IC.

Such a clock signal will be explained with reference to FIG. 3.

FIG. 3 is a frequency spectrum diagram illustrating the clock signal of the conventional image sensor module. In FIG. 3, the clock signal of the image sensor module includes a fundamental component and a plurality of harmonic components.

Meanwhile, examples of the clock signal include the main clock signal MCLK, a video clock signal PCLK and a I2C control clock signal SCLK.

The main clock MCLK signal is used to operate the CMOS image sensor and the image signal processing IC, and serves as a reference clock for the video clock PCLK. The main clock signal is generated from the TCXO or X-tal of the mobile phone either directly or through the baseband IC. Here, the main clock signal carries harmonic components besides a fundamental spectrum.

The video clock PCLK signal is used in synchronization of a video signal (RGB or YCbCr signal) which is fed through an actual sensor and the image signal processing IC. This video signal varies depending on size of video data. For example, the video signal varies according to the number of pixels (QCIF, QVGA or 2M), the frame rate and the chipset types.

Moreover, the I2C control clock SCLK signal is a synchronizing signal for controlling the image sensor module (ISM) independent from actual data.

Here, the main clock signal MCLK passes through a body of the image sensor module and a flexible printed circuit board (FPCB) and then the harmonic components of the main clock signal pass through air or the PCB and then are transmitted through an antenna of the CDMA mobile phone. The harmonic components transferred in this fashion are induced as noises into an actual cellular CDMA, GSM or next-generation communication frequency bandwidth.

A conventional method for overcoming such shortcomings will be explained hereunder.

Noises can be minimally radiated from the image sensor when both the telephone transmitter/receiver of the conventional CDMA mobile phone and the image sensor module are in an off state. To this end, noises are separated through a ground shielding, or the antenna and the image sensor module are physically spaced apart form each other at a greatest distance.

Alternatively, a low band pass filter is applied to the image sensor module to pass the fundamental component of the main clock MCLK and block the harmonic components.

As described above, the conventional method of reducing noises, i.e., harmonic components of the clock signal in the conventional CDMA mobile phone concerns utilizing the ground shielding or distancing the antenna from the image sensor module. However, such a method fails to sufficiently diminish the harmonic components of the clock signal of the image sensor module.

Furthermore, the low band pass filter is implemented through a passive device in practice, thereby significantly raising a device price and increasing filter size and costs.

In addition, a notch filter may be employed to remove the harmonic components from the clock signal. However, this fails to cancel noises outside a specified frequency band.

SUMMARY OF THE INVENTION

The present invention has been made to solve the foregoing problems of the prior art and it is therefore an object according to certain embodiments of the present invention is to provide a clock noise canceling circuit which is designed to eliminate a harmonic component of a preset frequency from a clock signal of e.g., an image sensor, thereby rendering other parts or signals less susceptible to the harmonic component, and can be substituted for an electromagnetic (EMI) filter.

According to an aspect of the invention for realizing the object, there is provided a clock noise canceling circuit including: a coupler for extracting a signal from a clock signal; a filter for selecting a harmonic component of a preset frequency in the extraction signal from the coupler; a phase shifter for phase inverting the harmonic component of the preset frequency from the filter; an automatic gain control amplifier for amplifying the phase-inverted harmonic component from the phase shifter; a combiner for combining the amplified component from the phase shifter with the clock signal to eliminate the harmonic component of the preset frequency from the clock signal; a power detector for detecting a power level of the harmonic component of the preset frequency in an output signal of the combiner; and a controller for controlling gain of the automatic gain control amplifier based on the power level of the harmonic component detected by the power detector, thereby canceling noises.

The controller is adapted to monitor the power level of the harmonic component from the power detector while varying the phase-inverted frequency from the phase shifter in order to control phase shifting at a frequency where the power level of the harmonic component is at a minimum.

The controller is adapted to control harmonic selection and phase shifting based on the harmonic component of the preset frequency.

The filter comprises a tunable filter for setting a pass band having the harmonic component as a center frequency under control of the controller.

The phase shifter is adapted to invert a phase of a frequency signal corresponding to the harmonic component from the filter under control of the controller.

The clock signal is generated by a clock signal generator and provided to an image sensor module.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

A clock noise canceling circuit of the invention is applicable to modules other than an image sensor module, i.e., modules requiring a clock signal such as a signal processing module and a tuner module. For explanatory purpose, the invention is only employed in the image sensor module.

Figure 1:
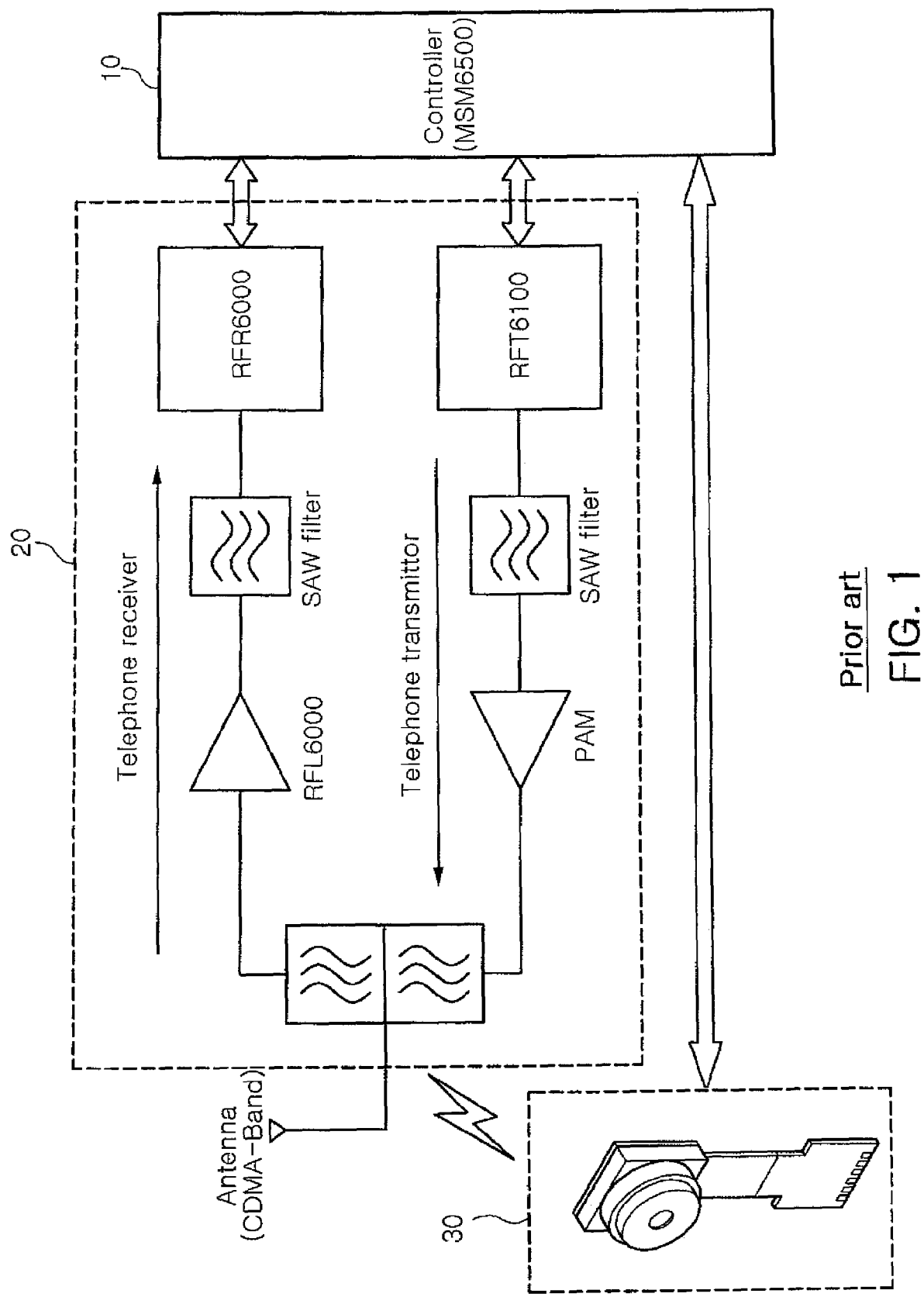
FIG. 1 is configuration view illustrating a conventional CDMA mobile phone.
Figure 2:
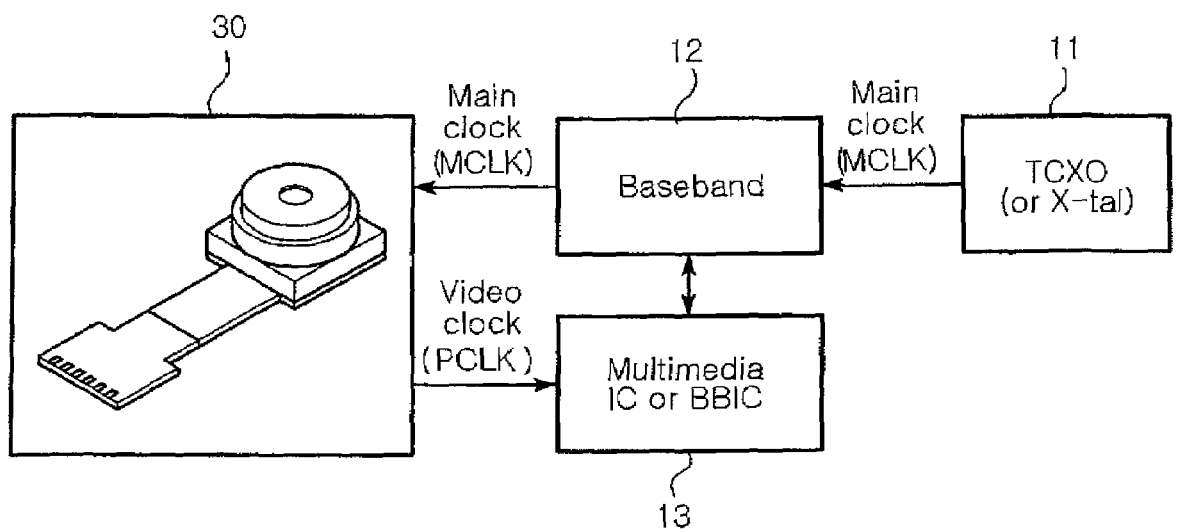
FIG. 2 is an explanatory view illustrating a clock signal of a conventional image sensor module.
Figure 3:
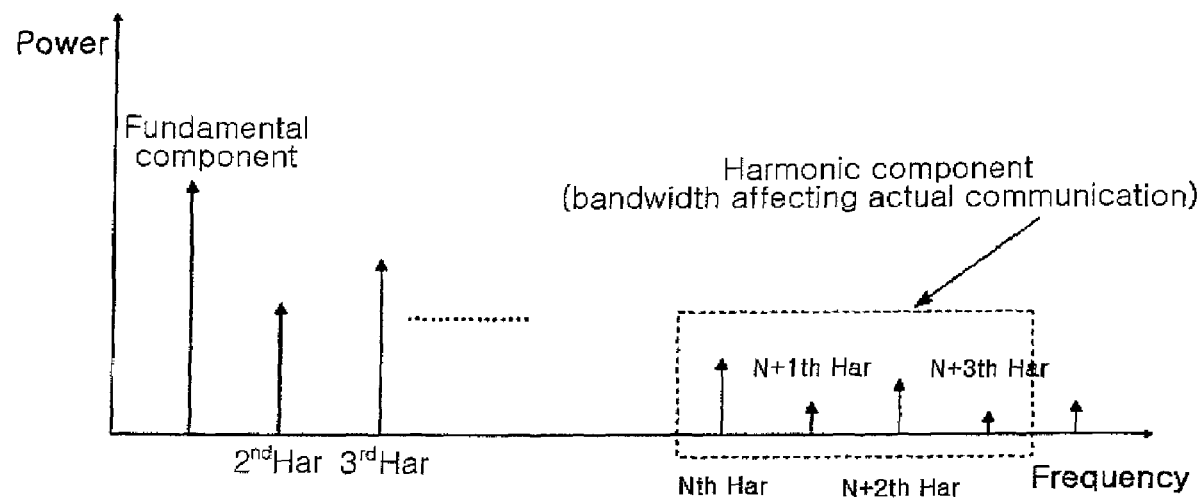
FIG. 3 is a frequency spectrum diagram illustrating a clock signal of a conventional image sensor module.
Figure 4:
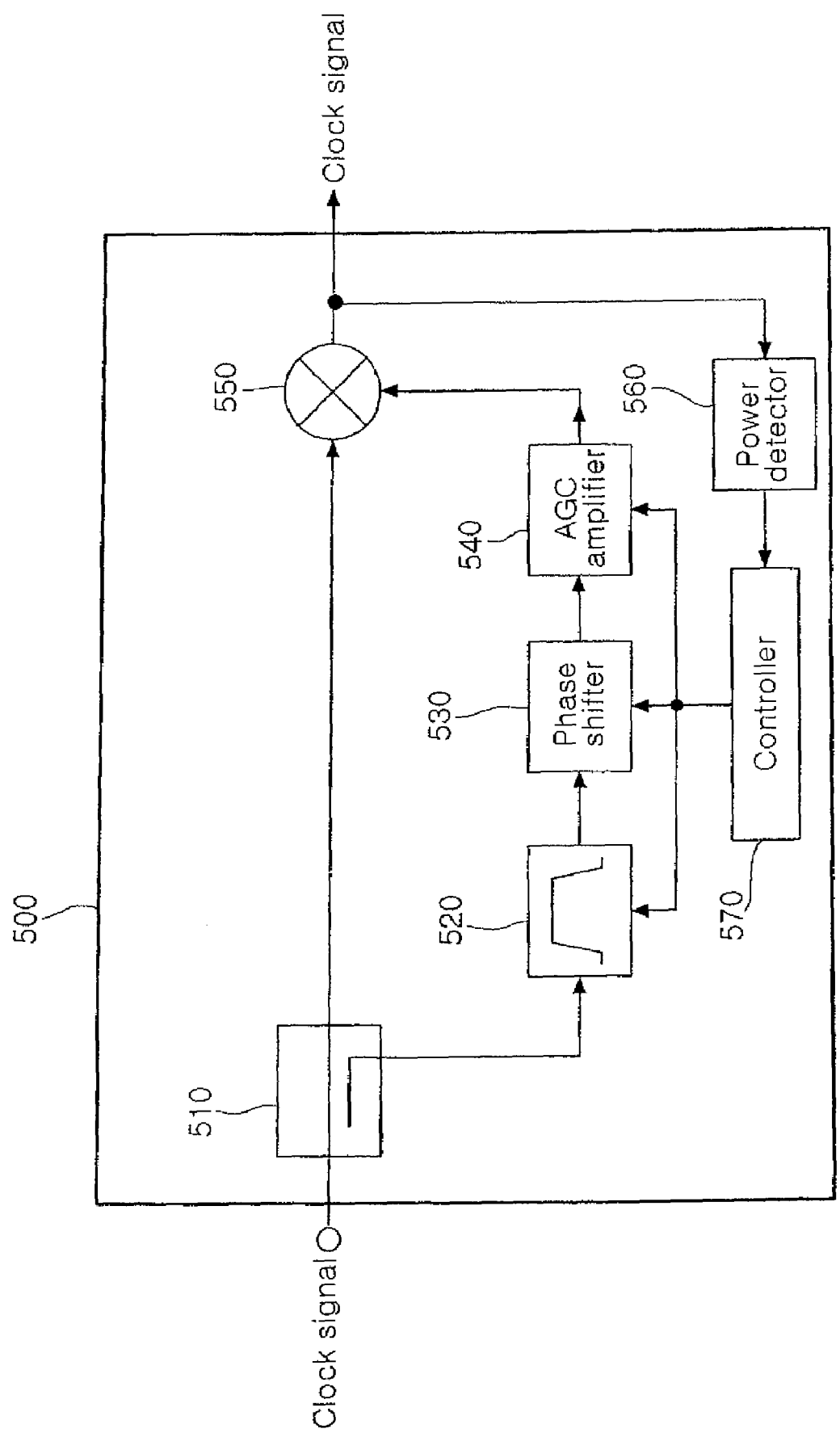
FIG. 4 is a circuit diagram illustrating a clock noise canceling circuit according to the invention.

FIG. 4 is a circuit diagram illustrating a clock noise canceling circuit according to the invention.

Referring to FIG. 4, the clock noise canceling circuit of the invention includes a coupler 510, a filter 520, a phase shifter 530, an automatic gain control (AGC) amplifier 540, a combiner 550, a power detector 560, and a controller 570. The coupler 510 extracts a signal from a clock signal. The filter 520 selects a harmonic component of a preset frequency in the extraction signal from the coupler 510. The phase shifter 530 phase inverts the harmonic component of the preset frequency form the filter 520. The AGC amplifier 540 amplifies the phase-inverted harmonic component from the phase shifter 530. The combiner 550 combines the amplified component from the phase shifter 530 with the clock signal to eliminate the harmonic component of the preset frequency from the clock signal. Also, the power detector 560 detects a power level of the harmonic component of the preset frequency in an output signal of the combiner 550. The controller 570 controls gain of the AGC amplifier 540 based on the power level of the harmonic component detected by the power detector, thereby canceling noises.

The controller 570 monitors the power level of the harmonic component from the power detector 570 while varying the phase-inverted frequency from the phase shifter 530 in order to control phase shifting at a frequency where the power level of the harmonic component is at a minimum.

Moreover, the controller 570 controls harmonic selection and phase shifting based on the harmonic component of the preset frequency.

Here the filter 520 may be configured as a tunable filter for setting a pass band having the harmonic component as a center frequency under control of the controller 570.

In addition, the phase shifter inverts a phase of a frequency signal corresponding to the harmonic component from the filter 520 under control of the controller 570.

Examples of the clock signal include a main clock signal (master clock), a video clock signal PCLK and a 12C control clock signal SCLK as described above. Here the main clock signal is generated by a clock signal generator of a CDMA mobile phone and fed to the image sensor module.

Figure 5:
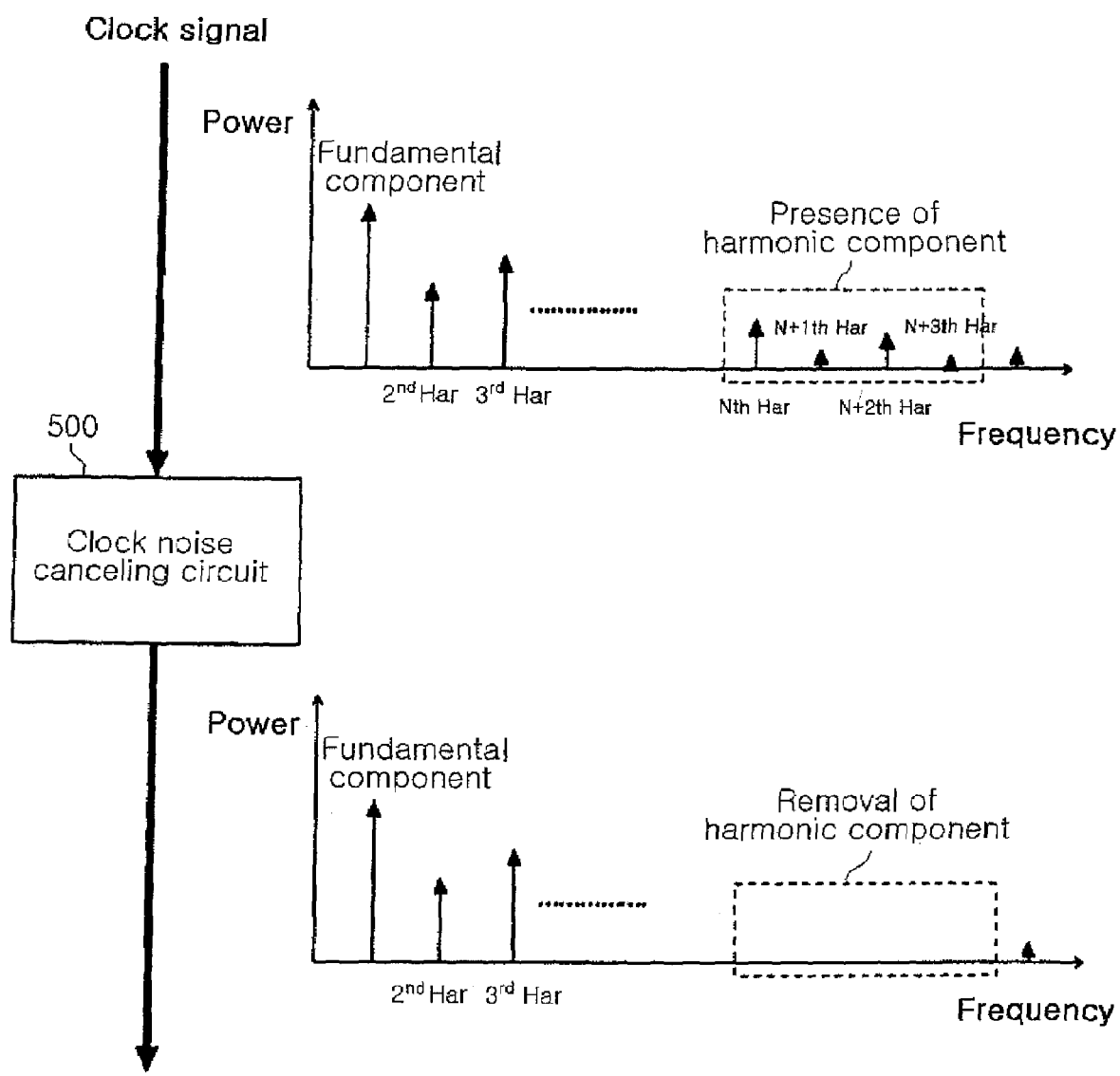
FIG. 5 is an explanatory view illustrating input and output clock signals of a clock noise canceling circuit according to the invention.

FIG. 5 is an explanatory view illustrating input and output clock signals of a clock noise canceling circuit. Referring to FIG. 5, the clock noise canceling circuit 500 of the invention removes a harmonic component from the clock signal.

Now operations and effects of the invention will be explained in great detail with reference to the attached drawings.

The clock noise canceling circuit of the invention is adopted for the CDMA mobile phone, thereby canceling noises from the clock signal that is fed to the image sensor module (ISM), i.e., a harmonic component of the clock signal.

First, referring to FIG. 4, the coupler of the invention extracts a signal representative of the clock signal of the image sensor module from the clock signal without inflicting loss on the clock signal and then feeds the extracted signal to the filter 520.

The filter 520 selects the harmonic component of the preset frequency in the extraction signal from the coupler 510 and then feeds it to the phase shifter 530.

For example, in a case where the clock signal (MCLK or PCLK) has a fundamental component of 4 MHz, it has a second harmonic component of 8 MHz, a third harmonic component of 12 MHz and a fourth harmonic component of 16 MHz. In this fashion, the clock signal has an infinite number of harmonic components.

The phase shifter 530 inverts the phase of the harmonic component of the preset frequency from the filter 520 to output to the AGC amplifier 540.

The AGC amplifier 540 amplifies the phase-inverted harmonic component from the phase inverter 530 by control of gain to output to the combiner 550. Here, the phase-inverted harmonic component is different in size from a harmonic component of an actual clock signal owing to presence of sampling gain and intermediate loss, thereby necessitating Auto Gain Control (AGC). These series of processes should be self-controlled in practice by a separate power detector and controller.

The combiner 550 combines the amplified component from the phase shifter 530 with the clock signal to eliminate the harmonic component of the preset frequency from the clock signal. In more detail, if the clock signal has a harmonic component, the harmonic component is phase inverted by the phase shifter 530 so that the harmonic component is cancelled by the phase-inverted harmonic component.

Then, the controller 570 of the invention monitors the harmonic component of the clock signal through the power detector 560 and controls gain of the AGC amplifier 540 based on a power level of the harmonic component detected by the power detector 560. That is, the phase-inverted harmonic component is amplified to match the size with the harmonic component of the clock signal, accordingly significantly reducing the harmonic component of the clock signal.

Moreover, the controller 570 monitors the power level of the harmonic component from the power detector 560 while varying the phase-inverted frequency from the phase shifter 530 in order to control phase shifting at a frequency where the power level of the harmonic component is at minimum. This noticeably diminishes the harmonic component of the clock signal.

As just described, the invention controls size and phase of the harmonic component of the clock signal more precisely and further eliminates the harmonic component from the clock signal through such control.

Meanwhile, the controller 570 controls harmonic selection and phase shifting based on the harmonic component of the preset frequency. In turn, the filter 520 sets a pass band having the harmonic component as a center frequency under control of the controller 570 and selects the harmonic component through the set frequency band more accurately.

In addition, the phase shifter 530 inverts a phase of a frequency signal corresponding to the harmonic component from the filter 520 under control of the controller 570. Consequently the harmonic component is phase-inverted more precisely and thus can be attenuated further from the clock signal.

Referring to FIG. 5, the clock noise canceling circuit 500 of the invention has been analyzed with respect to a spectrum of an inputted clock signal. As described above, the clock signal carries the fundamental component and harmonic components. But only some portions of harmonic components fall within spectrums that influence a mobile phone in practice.

When the clock signal passes through the clock noise canceling circuit 500 of the invention, the harmonic component of the preset frequency is eliminated from the clock signal on the FPCB and then the clock signal is transmitted. Here, the clock noise canceling circuit 500 of the invention can cancel the harmonic component which influences telephoning but not an overall operation thereof.

As set forth above, according to preferred embodiments of the invention, a clock noise canceling circuit applicable to a CDMA mobile phone is designed to eliminate a harmonic component of a preset frequency from a clock signal of an image sensor module. Thus the clock noise canceling circuit renders other parts or signals less susceptible to the harmonic component of the clock signal, and also can be substituted for an EMI filter.

That is, the clock noise canceling circuit of the invention allows the harmonic component from a clock signal to minimally affect other parts or signals, thereby attenuating noises.

The clock noise canceling circuit of the invention influences transmission/reception signals of a mobile phone and thus will be necessarily adopted for an image sensor module which basically performs video telephony such as wideband code division multiple access (WCDMA) and high speed downlink packet access (HSDPA). This obviates a need for the EMI filter or a shielding device.

While the present invention has been shown and described in connection with the preferred embodiments, it will be apparent to those skilled in the art that modifications and variations can be made without departing from the spirit and scope of the invention as defined by the appended claims.

What is claimed is:

1. A clock noise canceling circuit comprising:
    a coupler for extracting a signal from a clock signal;
    a filter for selecting a harmonic component of a preset frequency in the extraction signal from the coupler;
    a phase shifter for phase inverting the harmonic component of the preset frequency from the filter;
    an automatic gain control amplifier for amplifying the phase-inverted harmonic component from the phase shifter;
    a combiner for combining the amplified component from the phase shifter with the clock signal to eliminate the harmonic component of the preset frequency from the clock signal;
    a power detector for detecting a power level of the harmonic component of the preset frequency in an output signal of the combiner; and
    a controller for controlling gain of the automatic gain control amplifier based on the power level of the harmonic component detected by the power detector, thereby canceling noises.

2. The clock noise canceling circuit according to claim 1, wherein the controller is adapted to monitor the power level of the harmonic component from the power detector while varying the phase-inverted frequency from the phase shifter in order to control phase shifting at a frequency where the power level of the harmonic component is at a minimum.

3. The clock noise canceling circuit according to claim 1, wherein the controller is adapted to control harmonic selection and phase shifting based on the harmonic component of the preset frequency.

4. The clock noise canceling circuit according to claim 3, wherein the filter comprises a tunable filter for setting a pass band having the harmonic component as a center frequency under control of the controller.

5. The clock noise canceling circuit according to claim 3, wherein the phase shifter is adapted to invert a phase of a frequency signal corresponding to the harmonic component from the filter under control of the controller.

6. The clock noise canceling circuit according to claim 1, wherein the clock signal is generated by a clock signal generator and provided to an image sensor module.

* * * * *